United States Patent
Temmler et al.

(10) Patent No.: US 7,294,902 B2
(45) Date of Patent: Nov. 13, 2007

(54) TRENCH ISOLATION HAVING A SELF-ADJUSTING SURFACE SEAL AND METHOD FOR PRODUCING ONE SUCH TRENCH ISOLATION

(75) Inventors: Dietmar Temmler, Dresden (DE); Andreas Wich-Glasen, Langebrück (DE)

(73) Assignee: Infineon Technologies AG, Munich (DE)

( * ) Notice: Subject to any disclaimer, the term of this patent is extended or adjusted under 35 U.S.C. 154(b) by 252 days.

(21) Appl. No.: 10/485,984

(22) PCT Filed: Jul. 24, 2002

(86) PCT No.: PCT/EP02/08247

§ 371 (c)(1),
(2), (4) Date: Oct. 7, 2004

(87) PCT Pub. No.: WO03/015159

PCT Pub. Date: Feb. 20, 2003

(65) Prior Publication Data
US 2005/0040134 A1 Feb. 24, 2005

(30) Foreign Application Priority Data
Aug. 6, 2001 (DE) ................. 101 38 510

(51) Int. Cl.
*H01L 29/00* (2006.01)
(52) U.S. Cl. ......... 257/506; 257/E29.02; 257/E21.533; 216/19
(58) Field of Classification Search ............ None
See application file for complete search history.

(56) References Cited

U.S. PATENT DOCUMENTS

| | | | | |
|---|---|---|---|---|
| 5,712,185 A | * | 1/1998 | Tsai et al. | 438/424 |
| 5,940,716 A | | 8/1999 | Jin et al. | |
| 6,005,279 A | * | 12/1999 | Luning | 257/510 |
| 6,010,947 A | | 1/2000 | Kondo | |
| 6,143,623 A | * | 11/2000 | Tsuda et al. | 438/425 |
| 6,143,626 A | | 11/2000 | Yabu et al. | |
| 6,146,970 A | | 11/2000 | Witek et al. | |
| 6,251,746 B1 | | 6/2001 | Hong et al. | |
| 6,596,607 B2 | * | 7/2003 | Ahn | 438/424 |
| 6,955,972 B2 | * | 10/2005 | Lee et al. | 438/430 |
| 7,029,989 B2 | * | 4/2006 | Kim et al. | 438/429 |

FOREIGN PATENT DOCUMENTS

| | | |
|---|---|---|
| EP | 0 316 550 | 5/1989 |
| JP | 09312331 | 12/1997 |
| JP | 2000-332099 | 11/2000 |

OTHER PUBLICATIONS

Shiozawa et al., "Electrical Characteristics of Ultra-Fine Trench Isolation Fabricated by a New Two-Step Filling Process", Extended Abstracts of the Int'l Conference on Solid State Devices and Materials, Japan Society of Applied Physics, Tokyo, Japan, Bd. CONF. 1996, pp. 419-421.

(Continued)

*Primary Examiner*—Evan Pert
*Assistant Examiner*—Benjamin P. Sandvik
(74) *Attorney, Agent, or Firm*—Patterson & Sheridan, L.L.P.

(57) ABSTRACT

The invention relates to a trench isolation with a self-aligning surface sealing and a fabrication method for said surface sealing. In this case, the surface sealing may have an overlap region of the substrate surface or a receded region into which extends an electrically conductive layer formed on the substrate surface.

8 Claims, 12 Drawing Sheets

OTHER PUBLICATIONS

Search Report dated Apr. 24, 2003, relating to PCT/EP02/08247.
International Preliminary Examination Report dated Nov. 17, 2003, relating to PCT/EP02/8247.
German Examination Report dated Apr. 16, 2002, relating to DE 10138510.2.
K. Shiozawa et al. (1996) "Electrical Characteristics of Ultra-Fine Trench Isolation Fabricated by a New Two-Step Filing Process," *Jpn. J. Appl. Phys.* 35(12), pp. L1625-L1627.
German Examination report dated May 31, 2005.

* cited by examiner

TRENCH ISOLATION HAVING A SELF-ADJUSTING SURFACE SEAL AND METHOD FOR PRODUCING ONE SUCH TRENCH ISOLATION

CLAIM FOR PRIORITY

This application claims priority to International Application No. PCT/EP02/08247, which was filed in the German language on Jul. 24, 2002, which claims the benefit of priority to German Application No. 101 38 510.2, filed in the German language on Aug. 6, 2001.

TECHNICAL FIELD OF THE INVENTION

The invention relates to a trench isolation for electrically active components on a semiconductor substrate, and in particular to a shallow trench isolation (STI), and a method for fabricating such a trench isolation.

BACKGROUND OF THE INVENTION

Trench isolations constitute lateral isolation structures of adjacent electrically active regions which are formed as trenches that are etched in a semiconductor substrate and filled with an electrically insulating material. Such isolation structures are necessary since, on account of the high packing density of contemporary integrated circuits (IC), the distances between the active components on the semiconductor wafer are so small that the components reciprocally influence one another to a great extent. In this case, it is also possible for parasitic components to arise which disturb the function of the original components. Trench isolations are possibilities for isolating the adjacent electrically active regions.

Silicon dioxide ($SiO_2$) is generally used as material for filling the trenches in the case of trench isolations, and is deposited with the aid of thermal oxidation and oxide deposition into the trench structure. However, in the case of large aspect ratios of the trenches, which arise on account of the decreasing mutual distances between the components on a semiconductor substrate, it proves to be increasingly difficult to fill the isolation trenches. In particular, inner voids (shrink holes) occur in this case, and can disturb the function of the trench isolation or the further layer construction above the trench isolation.

Furthermore, damage caused by degrading process steps during the post STI processing can impair the effect of trench isolations. Thus, principally the removal and the roughening of the insulator filling are responsible for defects of the trench isolation or adjoining components.

Such defects can largely be avoided by elevated trench isolations and/or by restrictions to the post STI processing.

In order to protect the insulator layer of the trench isolation against damage which can arise during the post STI processing, U.S. Pat. No. 6,146,970 A proposes depositing a nitride layer on the insulator layer. For this purpose, in a first step, a polysilicon layer formed on an adhesion layer above the substrate surface is oxidized. Removal of the thin oxide layer thus produced yields, along the isolation trench, a narrow region of open substrate surface, which is likewise filled during the subsequent filling of the isolation trench. In this case, the width of the overlap region of the nitride covering layer is prescribed by the thickness of the removed oxide layer.

U.S. Pat. Nos. 6,010,947 A, 5,940,716 A and 6,143,623 A in each case describe methods for fabricating trench isolations which have regions partly overlapping the semiconductor substrate along their periphery.

U.S. Pat. No. 6,143,626 A discloses a method for fabricating a trench isolation in a semiconductor substrate, wherein a two-layer isolation trench filling is provided in order to avoid voids which can usually arise during the filling of isolation trenches.

SUMMARY OF THE INVENTION

The present invention provides an improved trench isolation which remains resistant to removing and roughening process steps after the fabrication of the trench isolation. Furthermore, the invention provides a method for fabricating such a trench isolation.

According to one embodiment of the invention, three layers are applied on a substrate surface and then an isolation trench is produced with the aid of removing process steps in the three layers and the underlying substrate. Afterward, the trench is filled with a first insulator layer and an insulating sealing layer arranged in a self-aligned manner with respect thereto, the sealing layer having a high resistance.

By virtue of the invention's formation of a sealing layer, the insulator layer in the isolation trench is protected against removing or modifying post STI processes. This prevents, inter alia, the formation of shrink-hole openings, void openings and also parasitic components. Furthermore, the need for ideal filling and subsequent high densification of the first insulator layer is reduced.

The use of a layer stack with a central layer arranged between the adhesion and hard mask layers makes it possible to vary the thickness of the sealing layer above the substrate surface during the fabrication of the trench isolation.

The invention's fabrication of the trench isolation with the aid of a layer stack having a topmost hard mask layer makes it possible to obviate an additional photolithographic mask step during the patterning of the underlying layers.

In one advantageous embodiment of the invention, in order to form the sealing layer, the second or the first layer is etched back laterally by a specific amount with the aid of isotropic etching processes. In this case, it is possible to vary the lateral extent and the configuration of the etched-back regions through a targeted choice of the process sequence. During the subsequent filling of the isolation trench with the sealing layer, the laterally etched-back regions are then also concomitantly filled and form a collar region along the periphery of the isolation trench which covers the substrate surface directly along the edge thereof.

The collar region of the sealing layer, which directly overlaps the substrate surface along the periphery of the isolation trench, protects the substrate surface situated directly below the overlap region against removing or modifying post STI processes.

The lateral extent and also the form of the overlap region require only little variation of the process sequence. The sealing layer can thus be optimally adapted in a simple manner to the specific requirements of the respective integrated circuit (IC).

A further advantage of the preferred embodiment of the invention is that the substrate surface situated directly below the collar region is also electrically insulated toward the top.

In a further advantageous embodiment of the invention, the sealing layer may have a narrowed partial section produced by the etching-back of the sealing layer or by means of a separation layer previously formed on the sidewalls of the isolation trench.

A further preferred embodiment provides for an electrically conductive layer to be applied to the substrate surface. In this case, the layer, preferably formed as an epitaxial semiconductor layer, is deposited selectively onto the substrate surface and also extends into the receded regions of the sealing layer. This laterally extends the active substrate surface adjoining the isolation trenches, which brings about improved electrical properties of the active components formed within the extended active regions.

BRIEF DESCRIPTION OF THE DRAWINGS

Two basic exemplary embodiments of the invention each with two subtypes are illustrated in the drawings and are explained in more detail in the description below.

In the figures.

DETAILED DESCRIPTION OF THE INVENTION

Figure 1A:
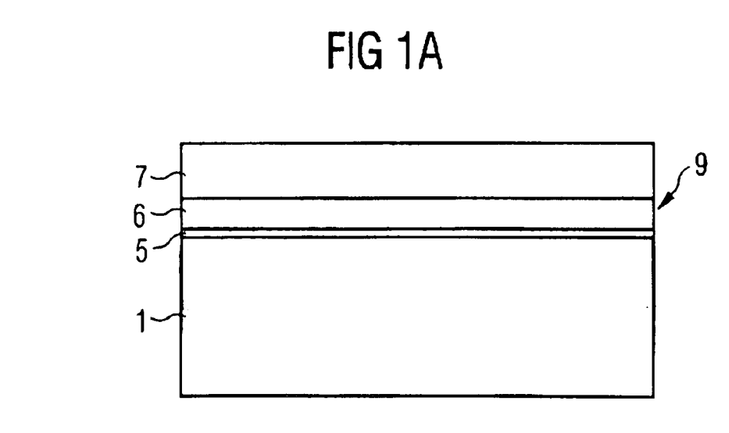
FIGS. 1A to 1J show a process sequence according to the invention for fabricating a trench isolation according to the invention with a lamellar overlap region of the sealing layer over the edge of the active semiconductor region.

FIG. 1A shows a cross section through a semiconductor substrate 1 to which a layer stack 9 has been applied in preceding process steps. The layer stack 9 comprises an adhesion layer 5, which forms a thin layer on the semiconductor substrate 1 and is preferably composed of $SiO_2$, a central layer 6, which is preferably composed of polysilicon, and a hard mask layer 7, which is preferably composed of $Si_3N_4$ and is used as a mask for the patterning of the underlying layers.

In the first process step of the fabrication method, firstly a photoresist layer 8 for forming a mask for patterning the isolation trenches 2 is applied to the hard mask layer 7. The photoresist layer 8 is formed with the aid of conventional methods. Afterward, the mask structure is transferred into the three underlying layers by means of an anisotropic etching method.

Figure 1B:
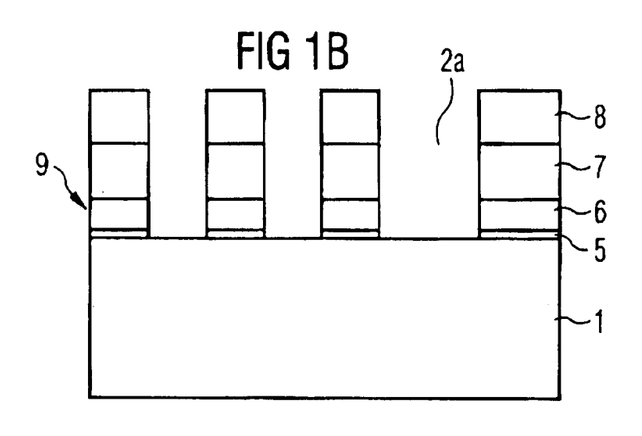

FIG. 1B shows the photoresist mask 8 with the layer stack patterned by the anisotropic etching operation on the semiconductor substrate 1. The structure of the photoresist layer 8 is transferred as far as the semiconductor substrate 1.

Figure 1C:
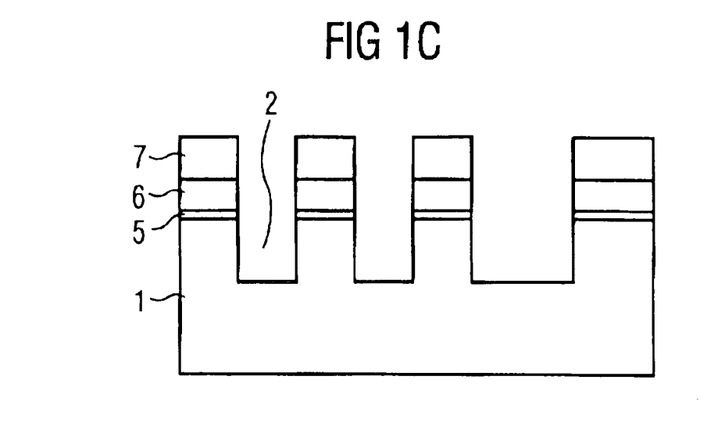

In the subsequent process step, the isolation trenches 2 are defined in the semiconductor substrate 1. For this purpose, the semiconductor substrate 1 is patterned by means of an anisotropic etching method, the semiconductor substrate 1 being removed as far as a defined depth. Since the hard mask layer 7 has a high resistance to the etching method chosen, it is removed only slightly by the etching operation, as shown in FIG. 1C, and serves as an etching mask for the semiconductor substrate 1.

Figure 1D:
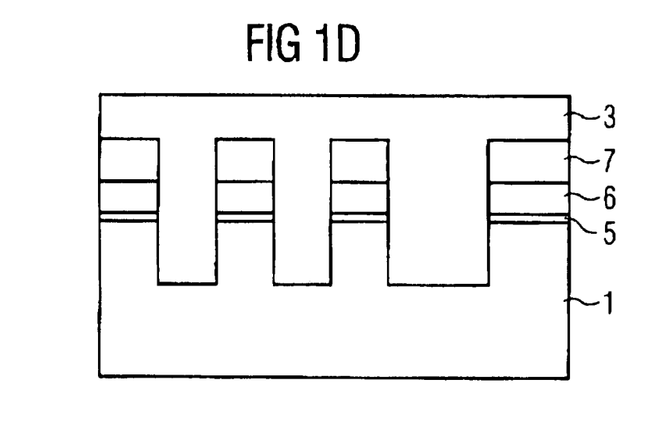

In the subsequent process step, an insulator layer 3 is formed on the patterned surface. As shown in FIG. 1D, in this case the previously produced trench structures are filled completely and in a manner free from shrink holes. $SiO_2$ is preferably used as insulator material because it can be deposited particularly conformally even in narrow isolation trenches 2 e.g. in the TEOS-CVD method.

Figure 1E:
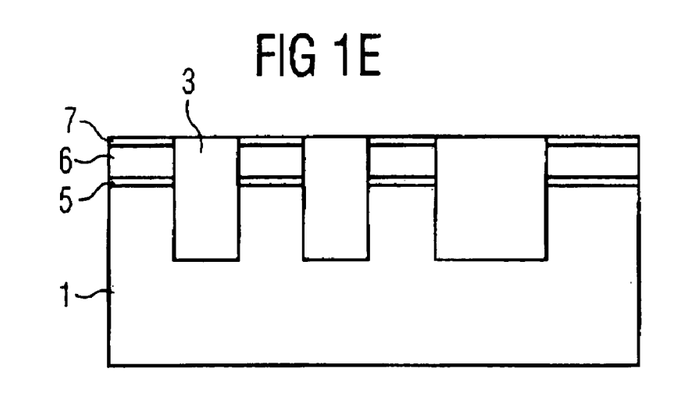

In the subsequent process step, the upper layer structures are removed in a planarizing manner down to a small layer thickness of the hard mask layer 7. A chemical mechanical polishing method (CMP) is preferably used in this case. FIG. 1E shows the layer stack with the planarized surface.

Figure 1F:
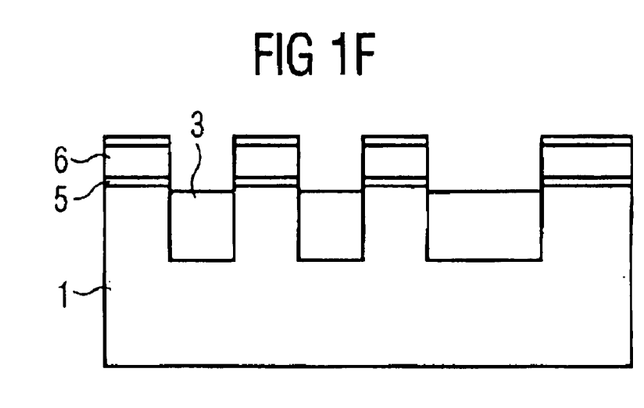

In the subsequent process step, the insulator layer 3 in the isolation trench 2 is removed with the aid of an anisotropic etching method, the etching method having a high selectivity with respect to the hard mask layer 7 and, consequently, the uncovered hard mask layer 7 being slightly removed during this etching process. In this case, the anisotropic etching process is preferably stopped just below the level of the substrate surface, as shown in FIG. 1F, and the last section of the insulator layer 3 is removed further with the aid of an isotropic etching method.

Figure 1G:
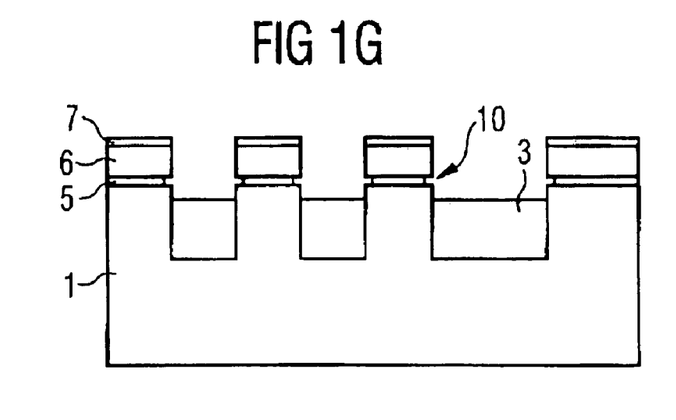

In this case, the isotropic etching method has a high selectivity with respect to the hard mask layer 7, with respect to the central layer 6 and with respect to the substrate 1, so that, during this etching process, the first insulator layer (3) is etched further and the adhesion layer 5 is etched back laterally. In this case, as shown in FIG. 1G, a gap 10 forms along the periphery of each isolation trench 2. The lateral extent of said gap 10 can be determined very precisely by the duration of this isotropic etching process and thus indirectly also by the duration of the preceding anisotropic etching process.

Figure 1H:
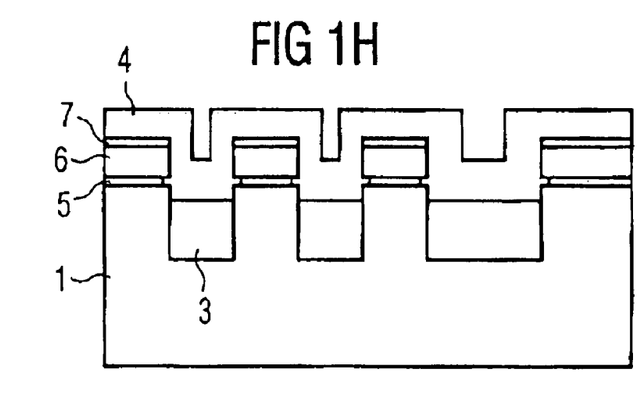

The etched-back regions of the insulator layer 3 and of the adhesion layer 5 in the isolation trenches 2 are then filled, in the subsequent process step, with a sealing material preferably composed of $Si_3N_4$. For this purpose, a sealing layer 4 is applied to the surface by means of a suitable deposition method and, as shown in FIG. 1H, coats the entire surface with a virtually uniform thickness. In this case, the isolation trenches 2 are filled as far as a height below the upper edge of the residual hard mask layer 7.

Figure 1I:
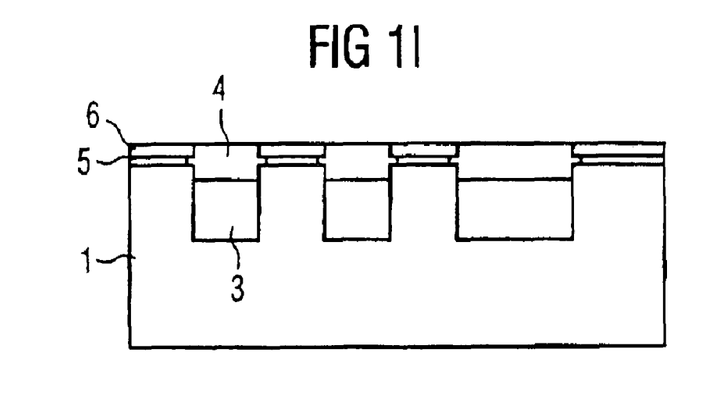

In the subsequent process step, the topmost layer structures are removed in a planarizing manner preferably as far as a level just above the upper edge of the adhesion layer 5, so that a thin residual layer of the central layer 6 remains between the isolation trenches 2. A CMP method is preferably used in this case. FIG. 1I shows the planarized surface with the isolation trenches 2 filled with the sealing layer 4.

After the coarse removal of the central layer 6, in the subsequent and final process step, the residues of the central layer 6 are removed with the aid of a selective etching method. In this case, the etching method preferably also has a high selectivity with respect to the adhesion layer 5, which is then removed by means of a further selective, isotropic etching.

Figure 1J:
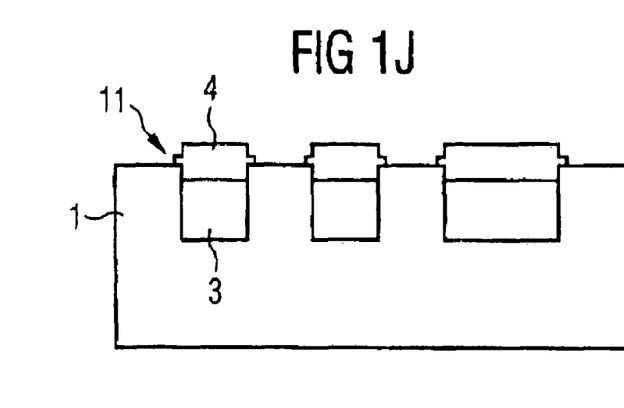

The surface of the semiconductor substrate 1 thus prepared then has, as shown in FIG. 1J, the completely formed trench isolation 20 which, in its lower partial regions, is filled with an insulator 3 as far as a level below the substrate surface and, in its upper partial regions, has a sealing layer 4 which is arranged above the latter and reaches as far as a level above the substrate surface. Along the periphery of each isolation trench 2, the sealing layer 4 has a lamellar region 11 which directly overlaps the substrate surface. The sealing layer 4 has a high resistance to removing and modifying methods, so that the underlying insulator layer 3 and the overlapped regions of the substrate surface are protected against effects of subsequent process steps.

FIGS. 2A to 2K show cross sections through a semiconductor substrate 1 in various process stages for the formation of the trench isolation 20 according to the invention with a T-shaped overlap region 14 of the sealing layer 4 over the substrate surface.

Figure 2A:
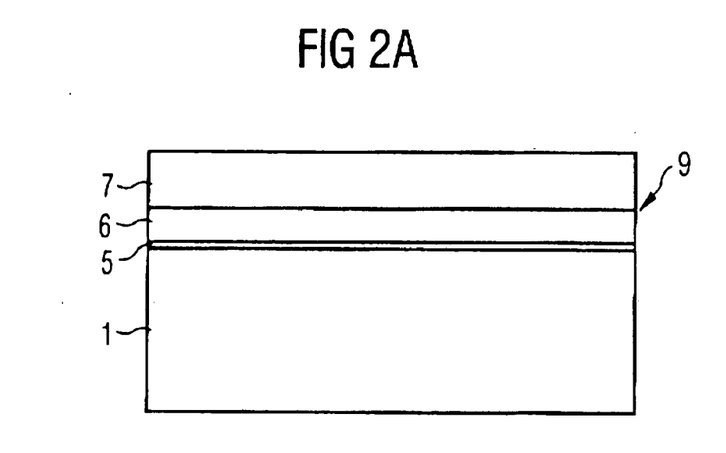
FIGS. 2A to 2K show a process sequence according to the invention for fabricating a trench isolation with a T-shaped overlap region of the sealing layer.

FIG. 2A shows a cross section through the semiconductor substrate 1 on which, analogously to FIG. 1A, a layer stack 9 has been applied in preceding process steps. Said layer stack 9 comprises an adhesion layer 5, which is formed in thin fashion on the semiconductor substrate 1 and is preferably composed of $SiO_2$, a central layer 6, which is preferably composed of polysilicon, and a hard mask layer 7, which is preferably composed of $Si_3N_4$ and serves as a mask for the patterning of the underlying layers.

The subsequent process steps of the fabrication method, opening regions (2a) for the isolation trenches 2 being produced photolithographically within the layer stack, take place analogously to the method from FIGS. 1A to 1J.

Figure 2B:
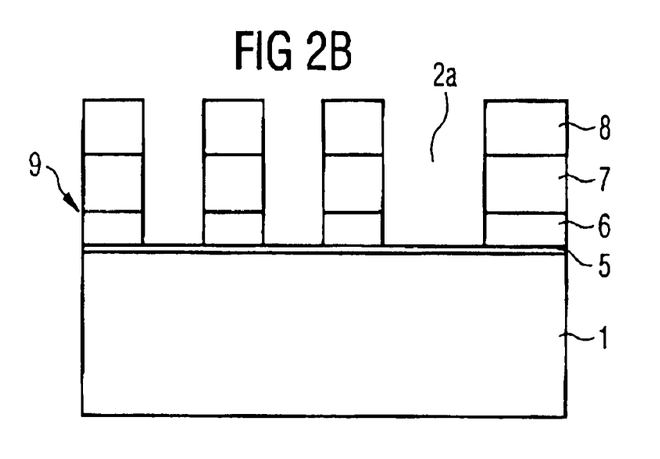

FIG. 2B shows the photoresist layer 8 on the layer stack 9 after the structure of the developed photoresist layer 8 was transferred to the underlying layers (5, 6). In contrast to FIG. 1B, however, the anisotropic etching process was stopped on the adhesion layer 5 after etching through the central layer 6.

Figure 2C:
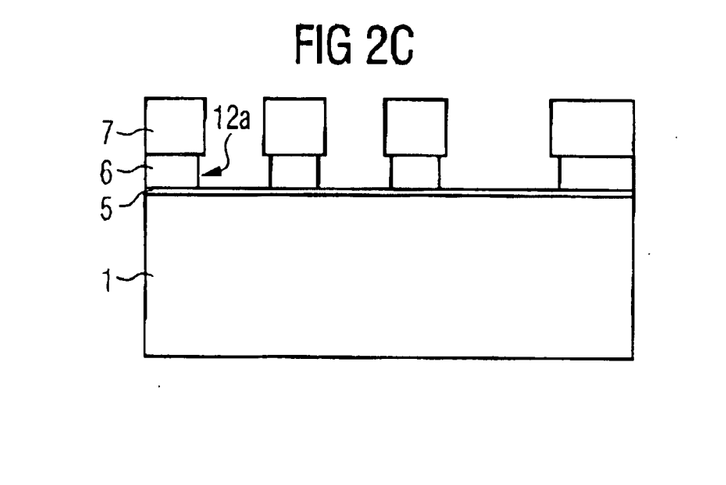
Figure 2D:
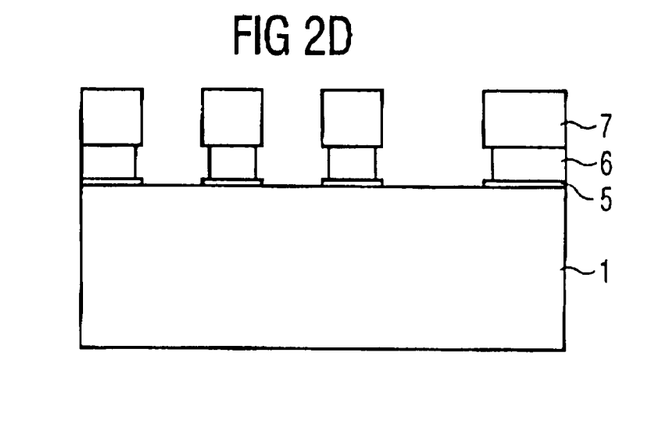

Afterward, the central layer 6 is etched back laterally by a defined amount by means of an isotropic etching method having a high selectivity with respect to the adhesion layer 5 and the hard mask layer 7. In this case, the lateral extent of the etched-back regions 12a of the central layer 6 can be defined very precisely by way of the duration of the isotropic etching step. FIG. 2C shows the etched-back central layer 6.

In the subsequent process step, the adhesion layer 5 is patterned with the aid of an anisotropic etching method. In this case, the hard mask layer 7 serves as an etching mask, so that the original structure of the photoresist 8 is then transferred to the adhesion layer 5.

In the subsequent process steps, the definition and the filling of the isolation trenches 2 in the semiconductor substrate 1 and also the subsequent planarization of the surface take place analogously to the processes illustrated in FIGS. 1C to 1F.

Figure 2E:
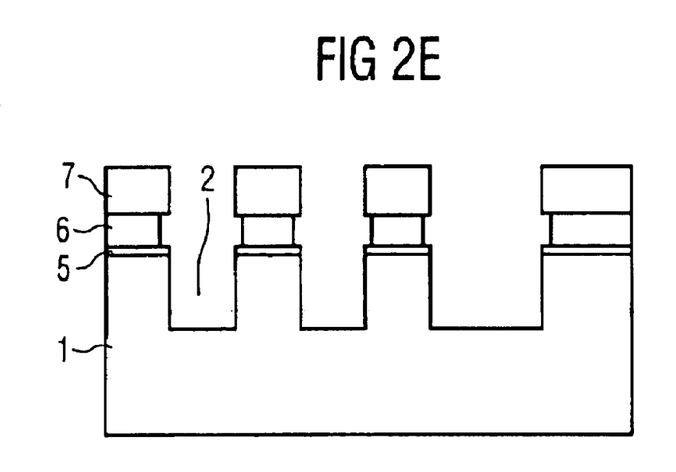

In this case, FIG. 2E shows the isolation trenches 2 formed within the semiconductor substrate 1. The structure of the hard mask layer 7 was transferred to the semiconductor substrate 1 in this case with the aid of an anisotropic etching step.

Figure 2F:
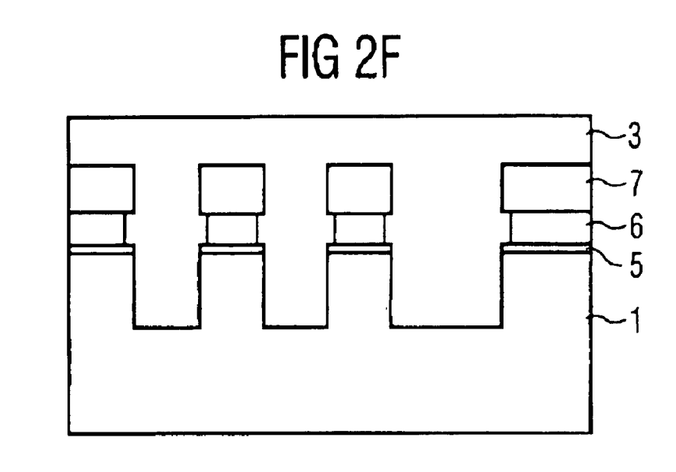

FIG. 2F shows the semiconductor substrate 1 after the formation of the first insulator layer 3, which is preferably composed of $SiO_2$. In this case, the isolation trenches 2 were preferably filled conformally with the aid of the TEOS method, the regions 12a produced by the etching-back of the central layer 6 also having been concomitantly filled.

Figure 2G:
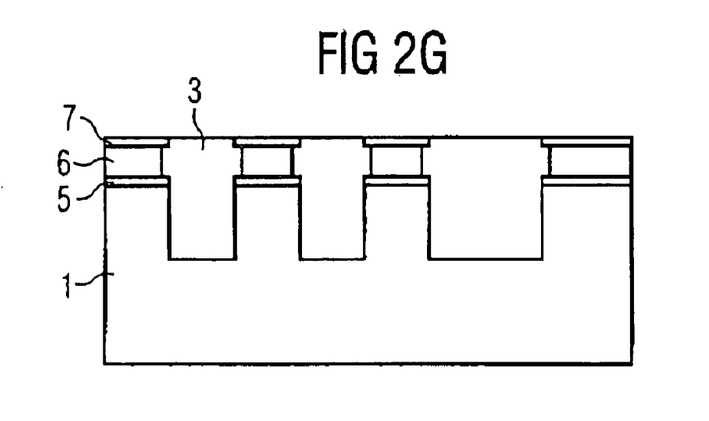

FIG. 2G shows the semiconductor substrate 1 after a planarizing removal method. In this case, the topmost layers (3, 7) have preferably been removed down to a small residual thickness of the hard mask layer 7 with the aid of a CMP method.

Figure 2H:
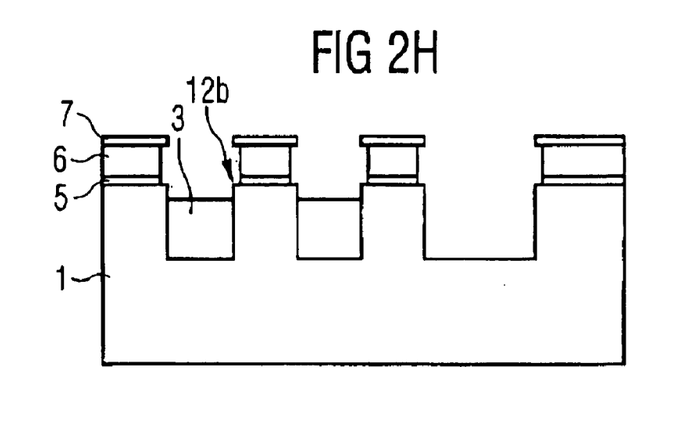

In the subsequent process step, the insulator layer 3 is removed as far as a level below the substrate surface with the aid of a planarizing etching method, the regions 12b of the adhesion layer 5 that were uncovered by the etching-back of the central layer 6 being concomitantly removed during the etching, as shown in FIG. 2H.

Figure 2I:
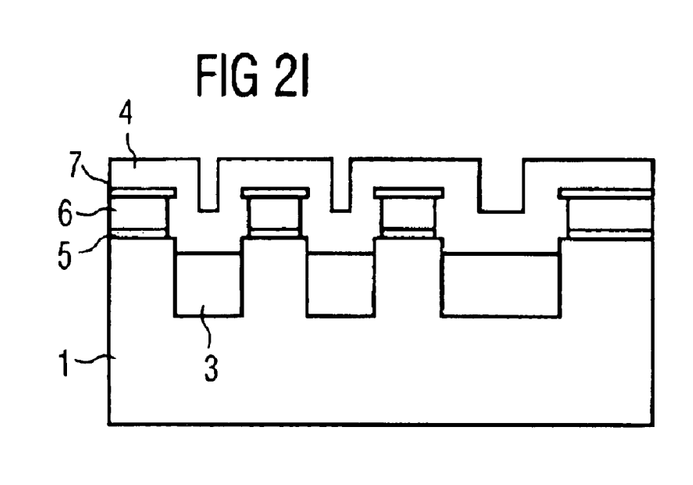

In the subsequent process step, the isolation trenches 2 are filled with a sealing layer 4 analogously to the process step illustrated in FIG. 1H. In this case, the sealing layer 4, which is preferably composed of $Si_3N_4$, is applied to the entire surface with the aid of a suitable deposition method. As shown in FIG. 2I, in this case, the removed regions of the adhesion layer 5 and also the regions 12a of the central layer 6 that were etched back in the preceding process steps are also filled conformally. In this case, the isolation trenches 2 are filled with the sealing layer 4 at least as far as the lower edge of the central layer 6.

Figure 2J:
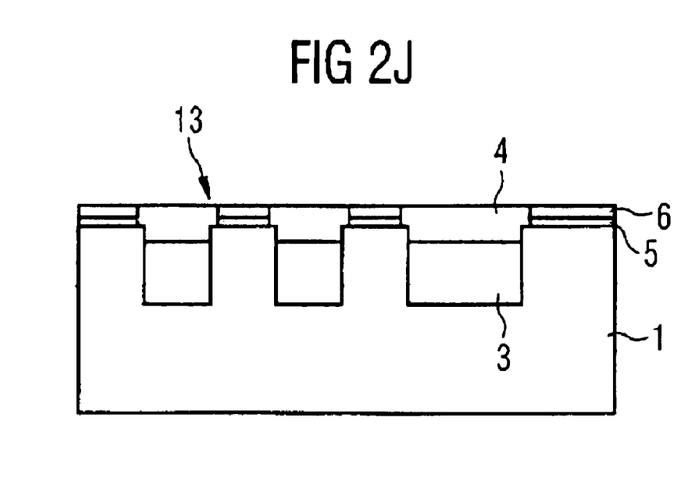

The subsequent process steps are effected analogously to the process steps shown in FIGS. 1I and 1J. In this case, firstly the topmost layer structures are removed in a planarizing manner as far as a defined depth preferably with the aid of a CMP method. The removal depth determines the thickness of the second insulator layer 4 and can be precisely adapted to the respective application. As shown in FIG. 2J, the insulator layer 4 is preferably removed as far as a level just above the upper edge of the adhesion layer 5, so that only a thin residual layer of the central layer 6 remains.

Figure 2K:
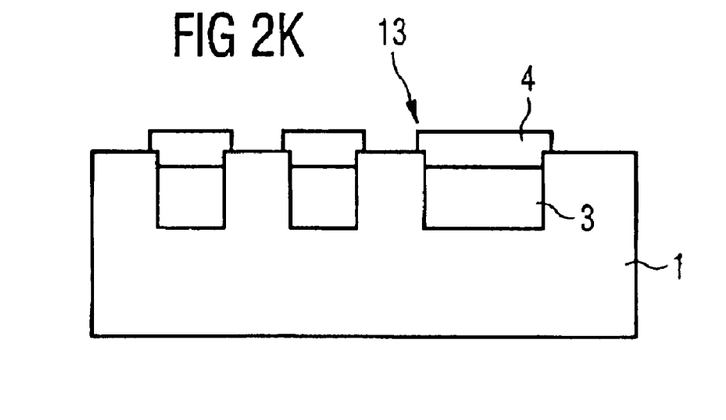

Afterward, the residues of the central layer 6 and also the adhesion layer 5 are removed with the aid of selective etchings as shown in FIG. 2K.

The surface of the semiconductor substrate 1 thus prepared then has, as shown in FIG. 2K, the completely formed trench isolation 20 which, in its lower partial regions, is filled with an insulator 3 as far as a level below the level of the substrate surface and, in its upper partial regions, has an overlying sealing layer 4 which extends as far as a level above the substrate surface. Along the periphery of each isolation trench 2, the sealing layer 4 has a T-shaped collar region 13 which covers the directly underlying substrate 1 in a self-aligning manner and protects it against the effects of subsequent process steps.

FIGS. 3A to 3L show a cross section through a semiconductor substrate 1 in various process stages for the formation of a trench isolation 20 terminated with a sealing layer 4, and an electrically conductive layer 1a that is formed on the substrate surface and extends into etched-back regions of the sealing layer 4.

Figure 3A:
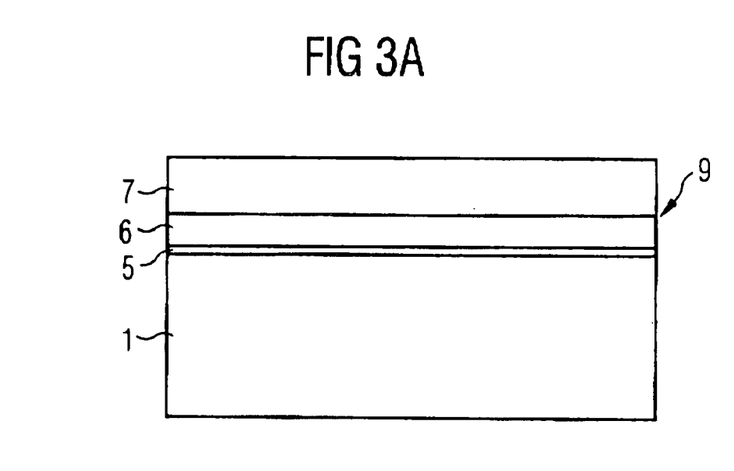
FIGS. 3A to 3L show a process sequence according to the invention for fabricating a trench isolation with a sealing layer that is tapered in the upper partial region, and with an electrically conductive layer that extends into the region of the isolation trench.
Figure 3B:
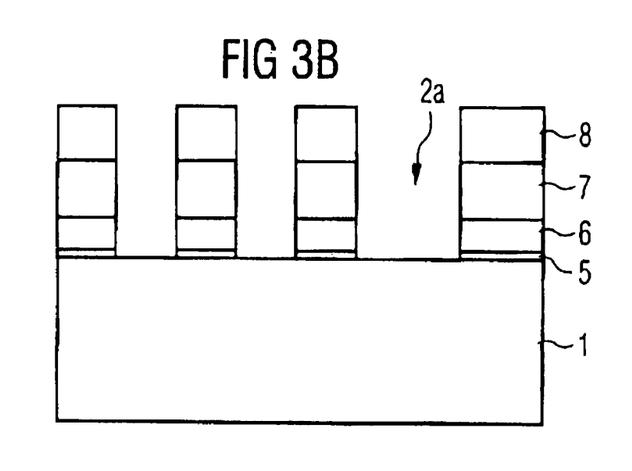

FIGS. 3A to 3E show a process sequence analogous to the process steps shown in FIGS. 1A to 1E. As shown in FIG. 3A, in this case, a layer stack 9, comprising an adhesion layer 5, a central layer 6 and a hard mask layer 7, is produced on a semiconductor substrate 1 and opening regions are patterned within the layer stack 9 with the aid of a photolithographic method. In this case, the photoresist layer 8 shown in FIG. 3B serves as a mask.

Figure 3C:
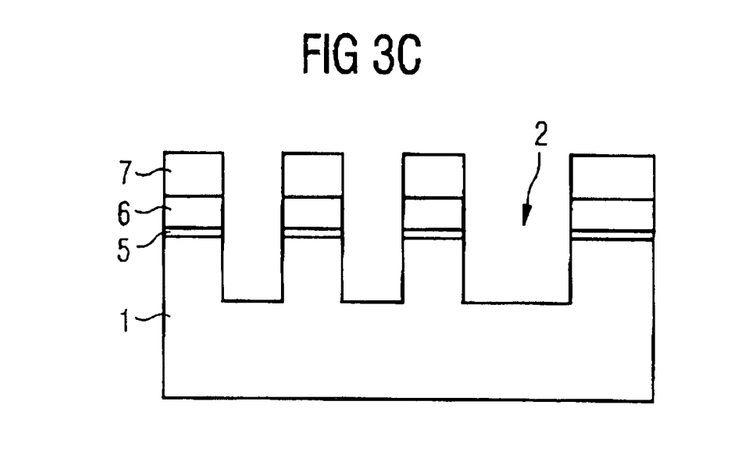
Figure 3D:
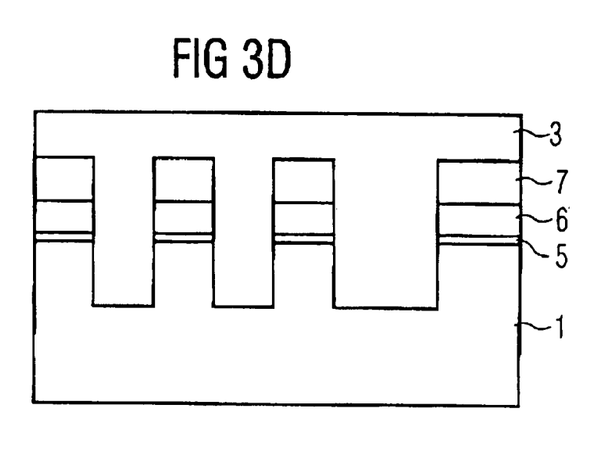

FIG. 3C shows three isolation trenches 2 formed within the substrate 1. In this case, the structure of the hard mask layer 7 was transferred to the substrate 1 with the aid of an anisotropic etching method. Afterward, a first insulator layer 3 is formed on the surface of the layer structures and, as shown in FIG. 3D, completely fills the isolation trenches 2.

Figure 3E:
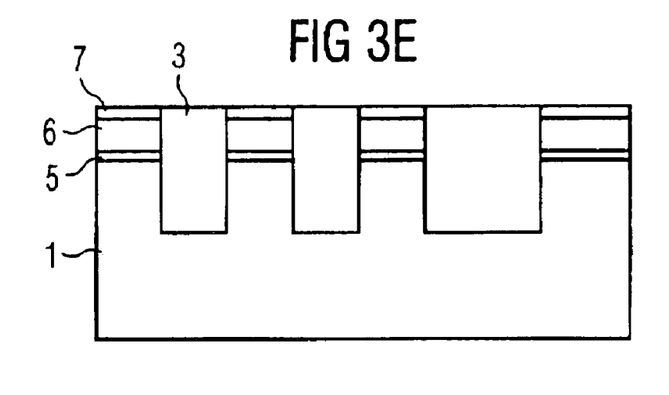

FIG. 3E shows the planarized layer stack 9. In this case, the first insulator layer 3 and the hard mask layer 7 were removed down to a residual thickness of the hard mask layer 7 with the aid of a CMP method.

Figure 3F:
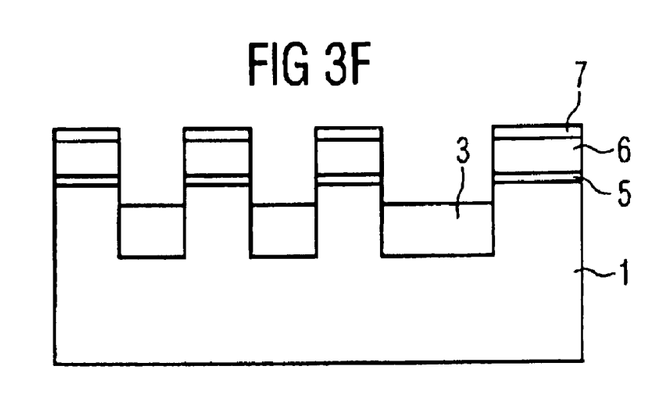

In the subsequent process step, as shown in FIG. 3F, the first insulator layer 3 is removed in a planarizing manner down to a specific depth below the substrate surface preferably with the aid of an anisotropic etching method.

Figure 3G:
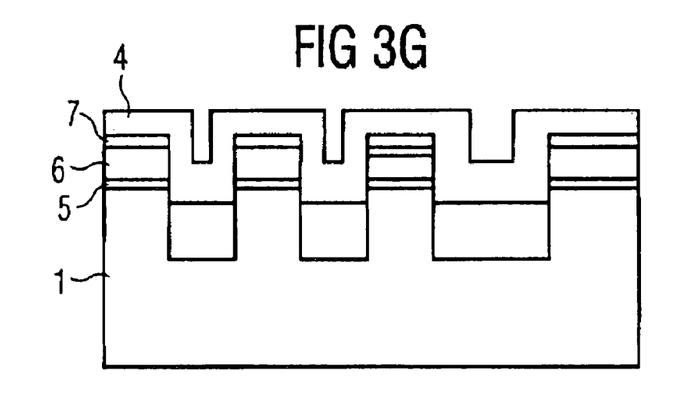

Afterward, a further insulator 4 is deposited onto the surface of the layer structures in a manner analogous to the processes shown in FIGS. 1H and 2I. In this case, as shown in FIG. 3G, those regions of the insulator layer 3 in the isolation trenches 2 that were etched back in the preceding process step are also filled conformally as far as a height below the upper edge of the hard mask layer 7.

Figure 3H:
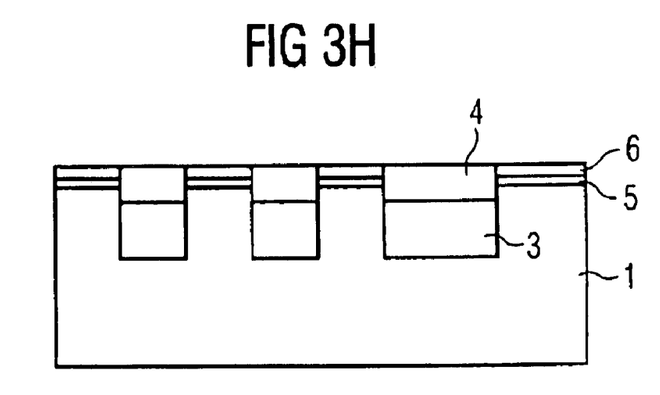

In the subsequent process step, as shown in FIG. 3H, the sealing layer 4, the hard mask layer 7 and the central layer 6 are removed down to a residual thickness of the central layer 6 in a manner analogous to the processes illustrated in FIGS. 1I and 2J. A CMP method is preferably used in this case.

Figure 3I:
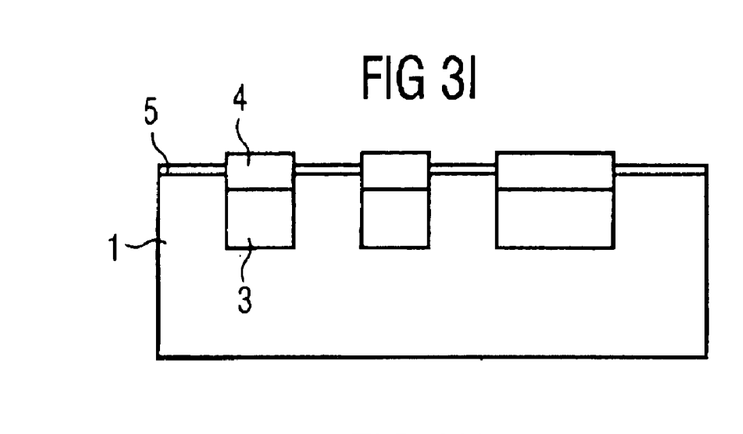

In the subsequent process step, as shown in FIG. 3I, the residual central layer 6 is selectively removed preferably with the aid of an isotropic etching method.

In order to enlarge the active regions 14 adjoining the isolation trenches 2, the sealing layer 4 within the isolation trenches is etched back laterally by a specific amount and the resulting regions are filled with an electrically conductive material 1a.

Figure 3J:
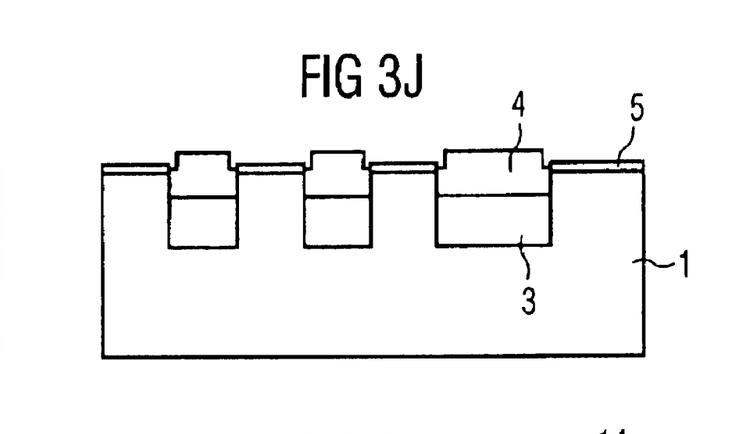

FIG. 3J shows the sealing layer 4 within the isolation trenches 2, the sealing layer having been etched back preferably with the aid of a selective isotropic etching method. In this case, as illustrated diagrammatically in FIG. 3J, the sealing layer 4 has the typical isotropic etching profile, the entire surface of the sealing layer 4 having been removed by a specific amount and the width of the upper regions of the sealing layer 4 having been reduced. At the same time, the edge region and the upper edge of the sealing layer 4 within each isolation trench 2 have been etched back, the edge regions having been receded approximately as far as the level of the substrate surface.

Figure 3K:
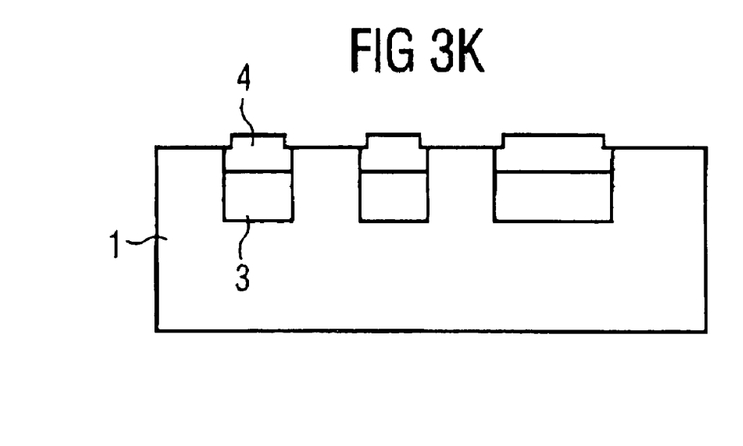

Afterward, as shown in FIG. 3K, the residual adhesion layer 5 is completely removed with the aid of an isotropic, selective etching method.

Figure 3L:
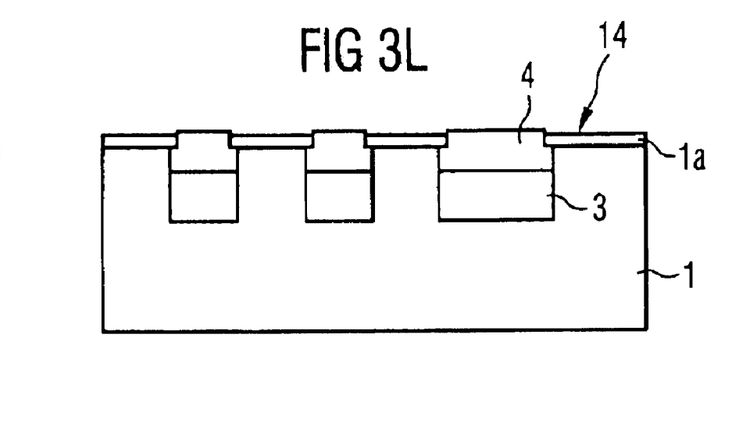

In the subsequent process step, an electrically conductive layer 1a is deposited onto the substrate surface and the receded edge regions of the sealing layer 4 to a point preferably just below the upper edge of the sealing layer 4. A selective epitaxy method is preferably used in this case, a semiconductor layer 1a preferably growing in crystalline fashion on the semiconductor substrate 1. On account of the selectivity of this process, the epitaxial semiconductor material grows only on the substrate surface. Since, during this process, the epitaxial semiconductor layer 1a also grows laterally as a result of the attachment of the semiconductor material to the vertical regions of the substrate surface, the previously produced edge regions of the sealing layer 4 are covered to an increasing extent by the epitaxial semiconductor layer 1a.

The epitaxial semiconductor layer 1a is preferably composed of the same semiconductor material as the substrate 1. The epitaxial growth in this case results in an optimum transition between the substrate 1 and the epitaxial semiconductor layer 1a. At the same time, the active regions that are usually defined in the surface region of the substrate 1 are extended laterally into the region of the isolation trenches 2.

FIGS. 4A to 4L show a cross section through a semiconductor substrate 1 in various process stages for the formation of a trench isolation 20 that is terminated, according to the invention, with a sealing layer 4, and an electrically conductive layer 1a that is formed on the substrate surface and extends into the regions of the trench isolation 20 that are formed by etching back separation layers 4a.

FIGS. 4A to 4F show a process sequence analogous to the process steps shown in FIGS. 1A to 1F.

Figure 4A:
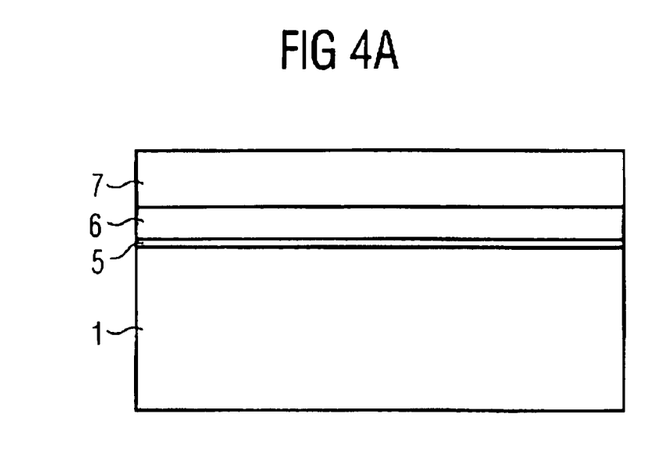
FIGS. 4A to 4L show a further process sequence according to the invention for fabricating a trench isolation with a sealing layer that is tapered by a separation layer, and an electrically conductive layer that extends into the region of the isolation trench.

FIG. 4A shows a layer stack 9 comprising an adhesion layer 5, a central layer 6 and a hard mask layer 7 on a semiconductor substrate 1.

Figure 4B:
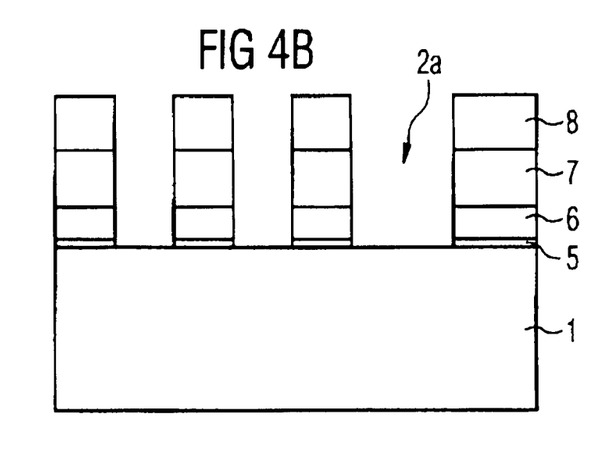

In FIG. 4B, opening regions for the isolation trenches 2 are patterned within the layer stack 9 with the aid of a photolithographic method.

Figure 4C:
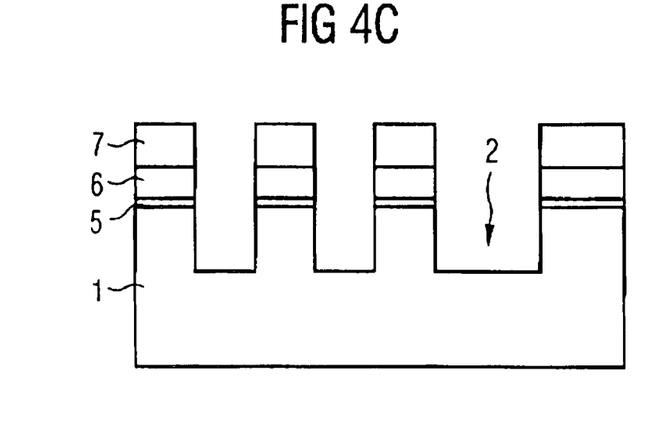

FIG. 4C shows three completely formed isolation trenches 2 within the substrate 1.

Figure 4D:
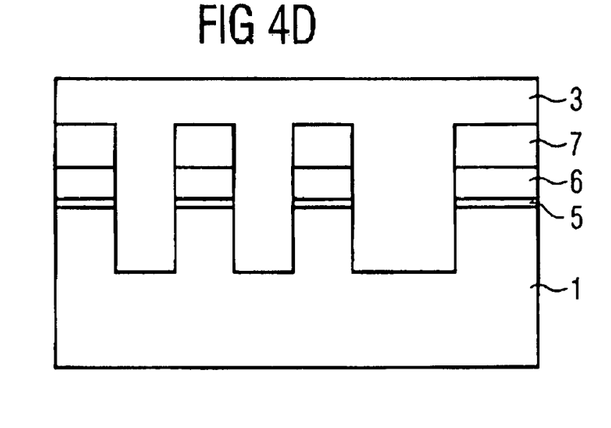

FIG. 4D shows the isolation trenches 2 filled with a first insulator 3.

Figure 4E:
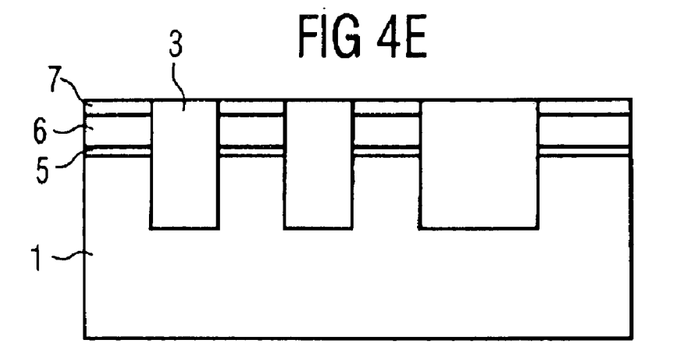

FIG. 4E shows the layer structures after a planarizing removal. In this case, the first insulator layer 3 and also the hard mask layer 7 were preferably removed down to a small residual thickness of the hard mask layer 7 preferably with the aid of a CMP method.

Figure 4F:
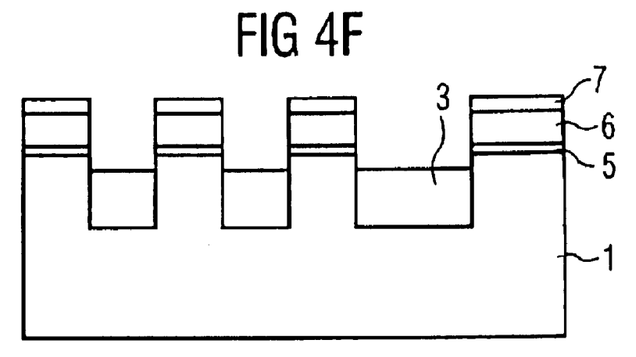

FIG. 4F shows the etched-back first insulator layer 3. In this case, the first insulator layer 3 was removed in a planarizing manner as far as a specific level below the substrate surface preferably with the aid of a selective anisotropic etching method.

Figure 4G:
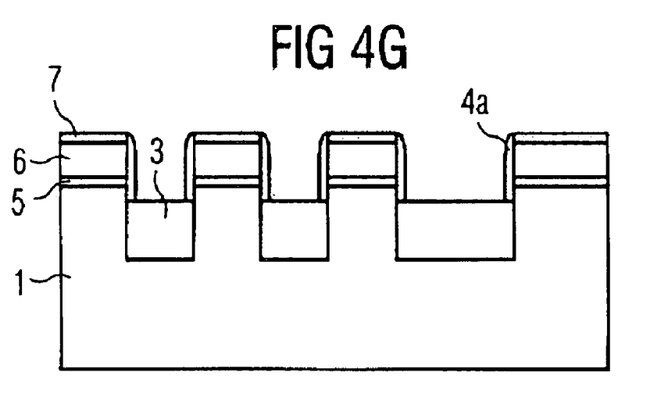

In the further course of the process, a sealing layer 4 is fabricated within each isolation trench 2. In order to extend the active regions 14 directly adjoining the isolation trenches 2 to regions of the isolation trenches 2, the sealing layer 4 is produced with a reduced cross section. For this purpose, as shown in FIG. 4G, a thin separation layer 4a is produced on the sidewalls of the isolation trench 2 and also on the sidewalls of the layer stack 9 within the opening region 2a. In this case, preferably with the aid of a vapor phase layer depositing method (CVD), an oxidation method or with the aid of a combination of both methods, a thin oxide layer is produced on the inner area of the isolation trenches 2 and the opening region 2a and subsequently removed again, except for the vertical regions of the separation layer 4a, preferably with the aid of an anisotropic etching method.

Figure 4H:
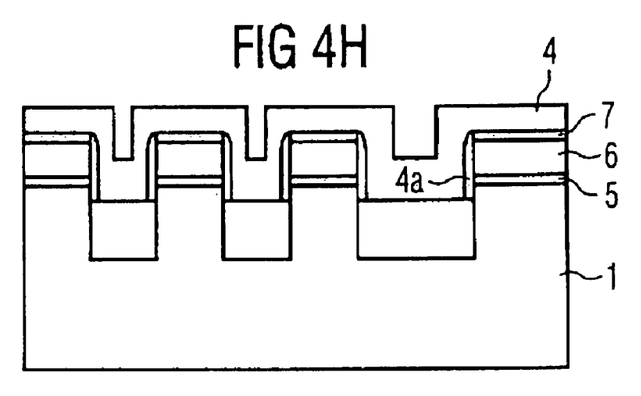

A sealing layer 4 of the isolation trenches 2 is subsequently fabricated, the sealing layer, as shown in FIG. 4H, being deposited onto the entire surface of the semiconductor wafer. The sealing layer 4 conformally fills the isolation trenches 2 preferably at least as far as the lower edge of the central layer 6.

Figure 4I:
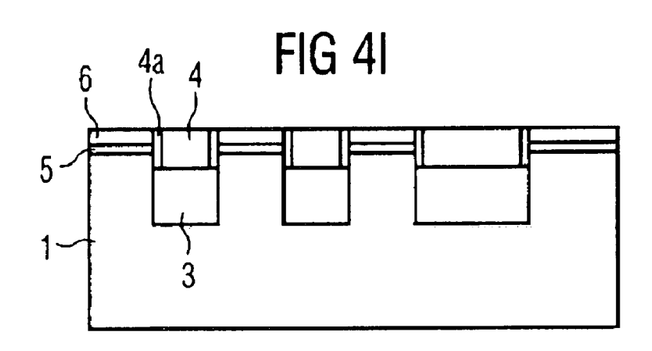
Figure 4J:
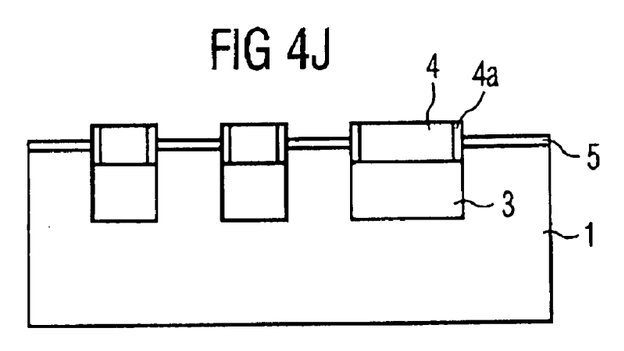

A planarizing removal of the topmost layers is effected in the subsequent process step. In this case, as shown in FIG. 4I, the sealing layer 4, the separation layer 4a, the hard mask layer, and the central layer 6 are removed down to a residual thickness of the central layer 6 preferably with the aid of a CMP method. The sealing layer 4 that remains in this case determines the maximum thickness of the subsequently fabricated epitaxial semiconductor layer 1a.

Figure 4K:
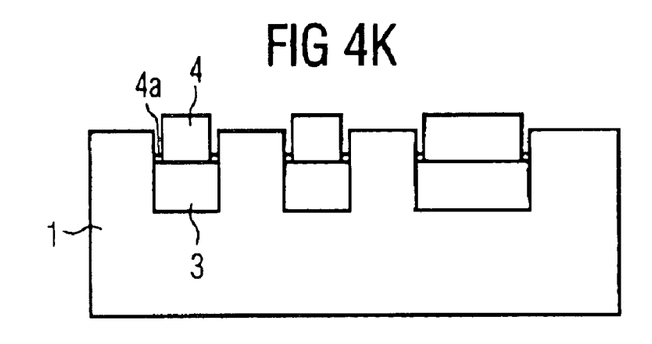

After the planarization of the surface, in the subsequent process step, the separation layer 4a is removed in order to produce the extended regions for the epitaxial semiconductor layer 1a. In this case, the separation layer 4a is removed completely or down to a small residual thickness preferably with the aid of an isotropic etching method. In this case, an etching method is preferably chosen which also completely removes the adhesion layer, as shown in FIG. 4K.

Figure 4L:
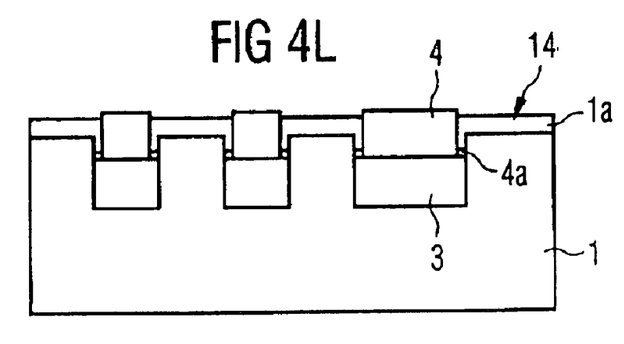

The final process step is effected analogously to the process step from FIG. 3L. In this case, as shown in FIG. 4L, an electrically conductive layer 1a, which is preferably composed of the same semiconductor material as the substrate 1, is grown epitaxially on the substrate surface. The semiconductor layer 1a growing laterally on the vertical sidewalls of the substrate 1 closely encloses the sealing layer 4 of the isolation trenches 2 and laterally extends the active regions 14 into the region of the isolation trenches 2.

The features of the invention disclosed in the above description, the claims and the drawings may be essential to the realization of the invention in its various embodiments both individually and in any desired combination.

| List of reference symbols | |
|---|---|
| 1 | Semiconductor substrate |
| 1a | Epitaxial semiconductor layer |
| 2a | Opening region for an isolation trench |
| 2 | Isolation trench |
| 3 | Lower trench filling |
| 4 | $Si_3N_4$ sealing layer |
| 5 | Thin $SiO_2$ adhesion layer |
| 4a | Thin separation layer |
| 6 | Polysilicon central layer |
| 7 | $Si_3N_4$ hard mask layer |
| 8 | Photoresist layer |
| 9 | Layer stack |
| 10 | Lamellar gap |
| 11 | Lamellar overlap region |
| 12a | Etched-back region of the central layer |
| 12b | Removed region of the adhesion layer |
| 13 | T-shaped overlap region |
| 14 | Active region |
| 20 | Trench isolation |

What is claimed is:

1. A semiconductor structure having a trench isolation in a semiconductor substrate comprising:
   an isolation trench having a first and a second insulator layer,
   the second insulator layer extending from a level below a surface of the semiconductor substrate as far as a level above a surface of the semiconductor substrate and being essentially planar with respect to the first insulator layer,
   the isolation trench and the first and second insulator layers having essentially parallel side walls,
   the second insulator layer having a higher resistance to removing and/or modifying methods than the first insulator layer, and
   the second insulator layer having, along the periphery of the isolation trench, a collar region directly on the surface of the semiconductor substrate with a defined lateral extent.

2. The semiconductor structure as claimed in claim 1, the collar region of the second insulator layer being formed in stepped fashion or in lamellar fashion.

3. The semiconductor structure as claimed in claim 1, the collar region of the second insulator layer having a lateral extent of 3 nm to 100 nm.

4. A semiconductor structure having a trench isolation in a semiconductor substrate,
   an isolation trench having a first and a second insulator layer,
   the second insulator layer extending from a level below a surface of the semiconductor substrate as far as a level above a surface of the semiconductor substrate and being essentially planar with respect to the first insulator layer,
   the isolation trench and the first and second insulator layers having essentially parallel side walls,
   the second insulator layer having a higher resistance to removing and/or modifying methods than the first insulator layer,
   the second insulator layer having a cross-section in a lower region and a second cross-section in the upper region, the first cross-section being a cross-section of the isolation trench, the second cross-section being narrower than the first cross-section,
   an electrically conductive layer being formed directly on the surface of the semiconductor substrate as far as a level below a surface of the second insulator layer, and
   the electrically conductive layer enclosing the upper region of the second insulator layer.

5. The semiconductor structure as claimed in claim 4, the upper region of the second insulator layer with the reduced cross section extending essentially as far as the level of the surface of the semiconductor substrate.

6. The semiconductor structure as claimed in claim 4, the upper region of the second insulator layer with the reduced cross section extending as far as a level below a surface of the semiconductor substrate, the electrically conductive layer filling the gap between the upper region of the second insulator layer and the isolation trench.

7. The semiconductor structure as claimed in claim 4, the electrically conductive layer being a semiconductor layer produced epitaxially.

8. A semiconductor structure having a trench isolation in a semiconductor substrate,
   an isolation trench having a first and a second insulator layer,
   the second insulator layer extending from a level below a surface of the semiconductor substrate as far as a level above a surface of the semiconductor substrate and being essentially planar with respect to the first insulator layer,
   the isolation trench and the first and second insulator layers having essentially parallel side walls,
   the second insulator layer having a higher resistance to removing and/or modifying methods than the first insulator layer,
   the second insulator layer having a reduced cross section in an upper region,
   an electrically conductive layer being formed directly on the surface of the semiconductor substrate as far as a level below a surface of the second insulator layer, and
   the electrically conductive layer enclosing the upper region of the second insulator layer, wherein
   the upper region of the second insulator layer with the reduced cross section extends as far as a level below a surface of the semiconductor substrate, and
   the electrically conductive layer fills the gap between the upper region of the second insulator layer and the isolation trench.

* * * * *

UNITED STATES PATENT AND TRADEMARK OFFICE
CERTIFICATE OF CORRECTION

PATENT NO. : 7,294,902 B2 Page 1 of 1
APPLICATION NO. : 10/485984
DATED : November 13, 2007
INVENTOR(S) : Dietmar Temmler et al.

It is certified that error appears in the above-identified patent and that said Letters Patent is hereby corrected as shown below:

In the Claims Section:

In Claim 4, at Column 10, Line 4, please insert --first-- before "cross-section".

Signed and Sealed this

Nineteenth Day of August, 2008

JON W. DUDAS
*Director of the United States Patent and Trademark Office*